(12) United States Patent
Lu et al.

(10) Patent No.: US 9,698,214 B1
(45) Date of Patent: Jul. 4, 2017

(54) CAPACITOR STRUCTURE OF INTEGRATED CIRCUIT CHIP AND METHOD OF FABRICATING THE SAME

(71) Applicant: Taiwan Semiconductor Manufacturing Co., Ltd., Hsinchu (TW)

(72) Inventors: Nan-Chi Lu, Tainan (TW); Chen-Chieh Chiang, Kaohsiung (TW); Chi-Cherng Jeng, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/088,045

(22) Filed: Mar. 31, 2016

(51) Int. Cl.
   *H01L 23/52* (2006.01)
   *H01L 49/02* (2006.01)
   *H01L 23/522* (2006.01)

(52) U.S. Cl.
   CPC .......... *H01L 28/87* (2013.01); *H01L 23/5223* (2013.01); *H01L 23/5226* (2013.01)

(58) Field of Classification Search
   None
   See application file for complete search history.

(56) References Cited

U.S. PATENT DOCUMENTS

| | | | | |
|---|---|---|---|---|
| 5,241,201 A * | 8/1993 | Matsuo | ............. | H01L 27/10817 257/307 |
| 5,497,028 A * | 3/1996 | Ikeda | ...................... | H01L 27/08 257/531 |
| 5,629,553 A * | 5/1997 | Ikeda | .................. | H01F 17/0006 257/379 |
| 5,652,693 A * | 7/1997 | Chou | ...................... | H01L 23/50 257/E23.079 |
| 5,705,963 A * | 1/1998 | Ikeda | ...................... | H01L 27/08 257/531 |
| 5,825,067 A * | 10/1998 | Takeuchi | ............ | H01L 27/1203 257/355 |
| 5,936,299 A * | 8/1999 | Burghartz | ............... | H01L 28/10 257/108 |
| 6,130,102 A * | 10/2000 | White, Jr. | ............... | H01L 28/60 257/E21.009 |
| 6,407,432 B1 * | 6/2002 | Nemoto | ............. | H01L 21/7624 257/354 |
| 6,674,131 B2 * | 1/2004 | Yokogawa | .......... | H01L 21/8213 257/124 |
| 7,176,546 B2 * | 2/2007 | Ahrens | ............... | H01L 27/0676 257/458 |
| 7,485,912 B2 * | 2/2009 | Wang | ..................... | H01G 4/005 257/306 |
| 7,579,643 B2 * | 8/2009 | Oh | ...................... | H01L 23/5223 257/296 |

(Continued)

*Primary Examiner* — Michael Lebentritt
(74) *Attorney, Agent, or Firm* — Jiang Chyun IP Office

(57) ABSTRACT

In accordance with some embodiments of the present disclosure, a capacitor structure of an integrated circuit chip includes an insulation layer, a first electrode, and a second electrode. The insulation layer includes an insulation partition and has a first trench and a second trench separated from the first trench by the insulation partition. The first electrode is disposed in the first trench. The second electrode is disposed in the second trench. The first electrode first electrode is arranged along a spiral trajectory and surrounds a spiral channel. The second electrode is disposed within the spiral channel.

20 Claims, 5 Drawing Sheets

(56) References Cited

U.S. PATENT DOCUMENTS

| | | | | |
|---|---|---|---|---|
| 7,875,911 B2* | 1/2011 | Takagi | ................ | H01L 23/5227 |
| | | | | 257/276 |
| 8,212,155 B1* | 7/2012 | Wright | .................... | H01L 23/00 |
| | | | | 174/259 |
| 9,443,966 B2* | 9/2016 | Yamaji | ................ | H01L 29/7395 |
| 2008/0024091 A1* | 1/2008 | Yamazaki | ................ | H01Q 1/36 |
| | | | | 320/166 |
| 2008/0253100 A1* | 10/2008 | Shigemura | .......... | H01L 23/3121 |
| | | | | 361/782 |
| 2008/0315300 A1* | 12/2008 | Higashino | ........... | H01L 29/4238 |
| | | | | 257/329 |
| 2010/0118455 A1* | 5/2010 | Kusunoki | ....... | H01L 21/823878 |
| | | | | 361/56 |
| 2010/0314710 A1* | 12/2010 | Yamaji | .................... | H01L 24/05 |
| | | | | 257/501 |
| 2011/0298446 A1* | 12/2011 | Shiraki | ................ | H01L 23/585 |
| | | | | 324/126 |
| 2012/0049273 A1* | 3/2012 | Hirler | ............. | H01L 21/823487 |
| | | | | 257/330 |
| 2012/0154026 A1* | 6/2012 | Karino | ................ | H01L 27/0629 |
| | | | | 327/543 |

* cited by examiner

CAPACITOR STRUCTURE OF INTEGRATED CIRCUIT CHIP AND METHOD OF FABRICATING THE SAME

BACKGROUND

An integrated circuit chip includes a plurality of active components and passive components interconnected based on actual design requirements. For integrating and interconnecting multiple components, an integrated circuit chip commonly has a plurality of metal wiring layers. The topography of each metal wiring layer is uneven when a hillock issue occurs during fabrication, which usually reduces the yield rate. In an instance, a contact via located at where the hillock is fails to extend to the predetermined depth so that an open circuit or an undesirable short circuit is generated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
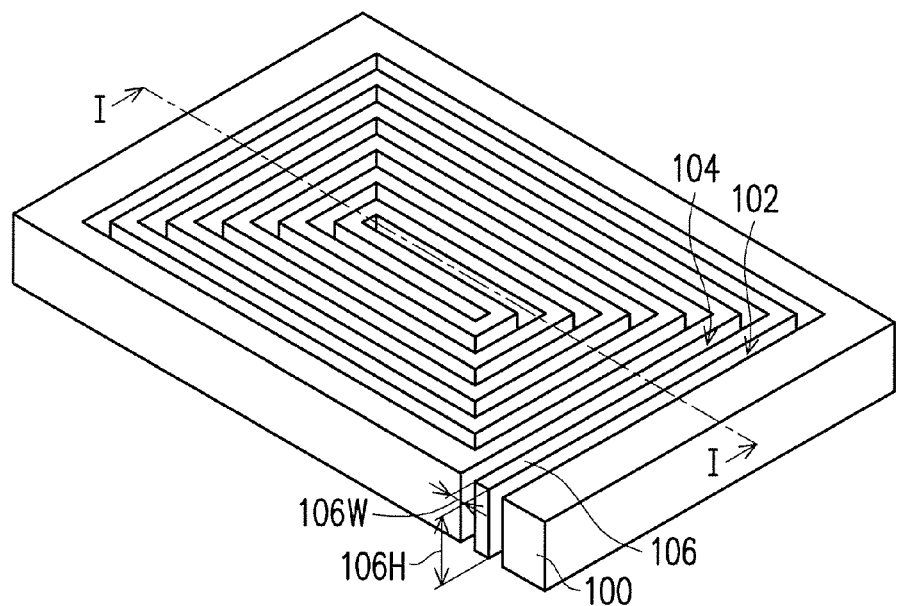
FIG. 1A schematically illustrates a step of a method of fabricating a capacitor structure of an integrated circuit chip in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
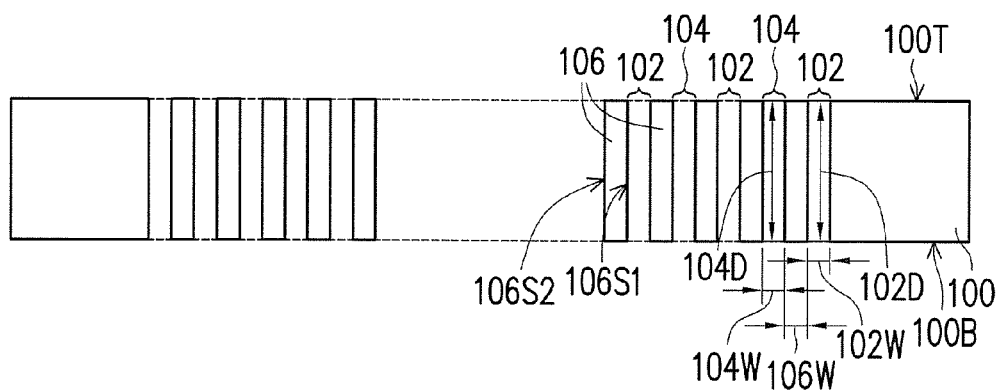
FIG. 1B schematically illustrates a cross sectional view of the structure depicted in FIG. 1A along the line I-I.

Referring to FIG. 1A and FIG. 1B, an insulation layer 100 of an integrated circuit chip is patterned to form a first trench 102 and a second trench 104 therein. The insulation layer 100 can be made of an insulation material, a high-K dielectric material or a combination thereof. In one instance, the insulation material includes silicon nitride, silicon oxide or multiple layers of insulation materials, such as silicon oxide and silicon nitride. The high-K dielectric material includes, for example, HfSiON, SiON or $HfO_2$. The insulation layer 100 is patterned by a lithography and an etch process, for example. For patterning the insulation layer 100, a photoresist is formed on an insulation material layer. Subsequently, a lithography process is performed by using one photo mask having a least one light shielding pattern thereon. During the lithography process, a radiation passing through the photo mask irradiates on the photoresist and therefore, a portion of the photoresist is exposed to the radiation while the rest portion thereof is not. Subsequently, the photoresist is developed such that the pattern of the photo mask is transferred to the photoresist. An etching process is then performed by using the developed and patterned photoresist as an etching mask to pattern the insulation material layer. After the above-mentioned patterning process, the insulation layer 100 comprising the first trench 102 and the second trench 104 therein is formed. The first trench 102 and the second trench 104 are thus formed by one lithography and etch process in an embodiment. In some embodiments, the first trench 102 and the second trench 104 extend downwardly from the top surface 100T of the insulation layer 100 to the bottom surface 100B of the insulation layer 100, as shown in FIG. 1B. In other words, the first trench 102 and the second trench 104 penetrate the insulation layer 100. In alternative embodiments, the first trench 102 and the second trench 104 extend downwardly from the top surface 100T of the insulation layer 100 to the interior of the insulation layer 100. In other words, the first trench 102 and the second trench 104 do not penetrate the insulation layer 100.

As shown in FIG. 1A and FIG. 1B, on the top surface 100T of the insulation layer 100, the trajectory of the first trench 102 and the trajectory of the second trench 104 are respectively a spiral trajectory as shown in FIG. 1, wherein the trajectory of the first trench 102 and the trajectory of the second trench 104 are not intersected with each other. In alternative embodiments, the first trench 102 and the second trench 104 are respectively arranged along a linear trajectory, a zigzag trajectory, a meander trajectory, or the like. The insulation layer 100 includes an insulation partition 106 having a wall-like structure. The first trench 102 and the second trench 104 are spaced apart by the insulation partition 106. The insulation partition 106 includes a first side surface 106S1 exposed by the first trench 102 and a second side surface 106S2 exposed by the second trench 104. The edge of the first trench 102 is surrounded by the first side surface 106S1 of the insulation partition 106 and the edge of the second trench 104 is surrounded by second side surfaces 106S2 of the insulation partition 106. In some embodiments, the insulation partition 106 is sandwiched between the first trench 102 and the second trench 104. The insulation partition 106 between the first trench 102 and the second trench 104 has a constant width 106W. The depth 102D of the first trench 102 is greater than the width 102W of the first trench 102 and the depth 104D of the second trench 104 is greater than the width 104W of the second trench 104. The height 106H of the insulation partition 106 is greater than a width 106W of the insulation partition 106. In some embodiments, the depth 102D of the first trench 102, the depth 104D of the second trench 104, the height 106H of the insulation partition 106 and the thickness of the insulation layer 100 are equivalent to each other. In alternative embodiments, the depth 102D of the first trench 102, the depth 104D of the second trench 104 and the height 106H of the insulation partition 106 are smaller than the thickness of the insulation layer 100. In some embodiments, a ratio of the depth 102D to the width 102W of the first trench 102 ranges from 2 to 10 and a ratio of the depth 104D to the width 104W of the second trench 104 ranges from 2 to 10.

Figure 2A:
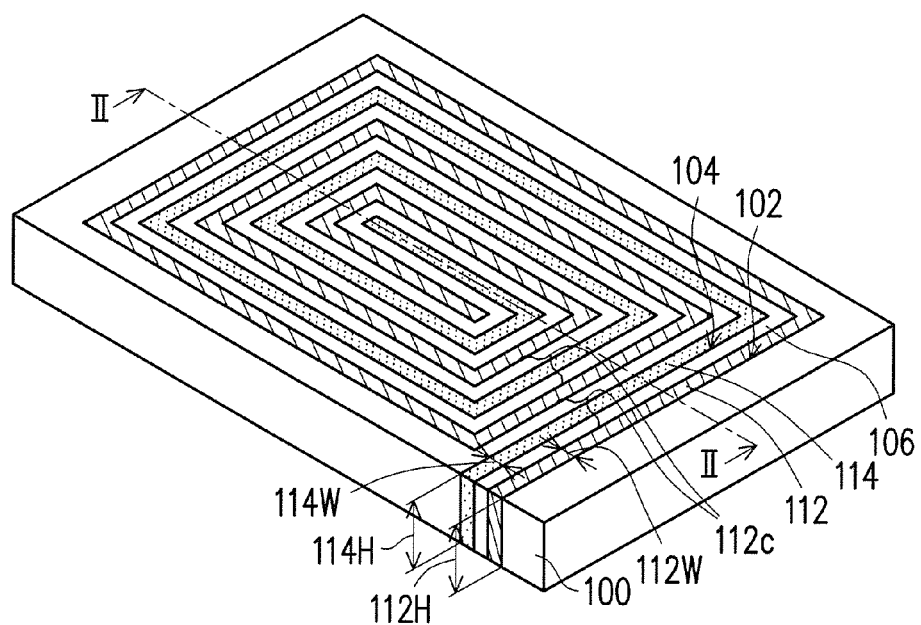
FIG. 2A schematically illustrates a step of a method of fabricating a capacitor structure of an integrated circuit chip in accordance with some embodiments.
Figure 2B:
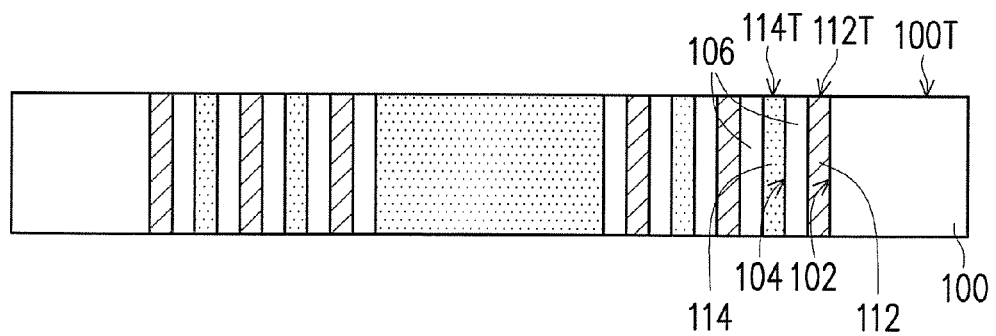
FIG. 2B schematically illustrates a cross sectional view of the structure depicted in FIG. 2A along the line II-II.

Referring to FIG. 2A and FIG. 2B, the first trench 102 and the second trench 104 are filled with a conductive material to respectively form a first electrode 112 and a second electrode 114. The first electrode 112 formed in the first trench 102 and the second electrode 114 formed in the second trench 104 are spaced apart by the insulation partition 106. The first electrode 112 and the second electrode 114 are formed by the same material, for example. In an embodiment, the method of filling the conductive material into the first trench 102 and the second trench 104 includes chemical vapor deposition (CVD), physical vapor deposition (PVD), atomic layer deposition (ALD), high density plasma CVD (HDPCVD), plating, other suitable methods, and/or combinations thereof. In some embodiments, the conductive material filled into the first trench 102 and the second trench 104 includes a single layer of conductive material or multiple layers of conductive material. The conductive material includes, for example, titanium, tungsten, aluminum, copper, metal alloys, metal silicide, other suitable materials, and/or combinations thereof. Accordingly, the first electrode 112 and the second electrode 114 have the work function capable of providing desired electric property. In some embodiments, the capacitance coupling between the first electrode 112 and the second electrode 114 is enhanced when the insulation layer 100 is made of high-K dielectric material.

The first electrode 112 and the second electrode 114 respectively have a shape corresponding to the first trench 102 and the second trench 104. In some embodiments, the first trench 102 and the second trench 104 are arranged along two spiral trajectories and therefore, the first electrode 112 is formed to surround a spiral channel 112C. The second electrode 114 is disposed within spiral channel 112C and arranged along the spiral trajectory of the second trench 104. In some alternative embodiments, the first electrode 112 and the second electrode 114 are not in contact with each other owing that the first trench 102 and the second trench 104 are spaced apart from each other. In the cross sectional view as shown in FIG. 2B, portions of the first electrode 112 and portions of the second electrode 114 are alternately arranged in a manner that the first, the second, the first, and the second electrodes are sequentially appeared in a direction parallel to the plane of the insulation layer 100.

In some embodiments, a planarization process can be performed after filling the conductive material into the first trench 102 and the second trench 104. In some embodiments, the planarization process includes polishing the first electrode 112, the second electrode 114 and the insulation layer 100 by a Chemical-Mechanical Polishing (CMP) process. Accordingly, the first electrode 112 and the second electrode 114 are physically and electrically separated from each other and a substantially smooth topography is formed. In some embodiments, the top surface 112T of the first electrode 112 and the top surface 114T of the second electrode 114 are aligned to the top surface 100T of the insulation layer 100 and are co-planar or at proximately the same elevation.

The first electrode 112 in the first trench 102 and the second electrode 114 in the second trench 104 are separated from each other by the insulation partition 106 and the distance between the first electrode 112 and the second electrode 114 can be constant when the width 106W of the insulation partition 106 is constant. The capacitance coupling between the first electrode 112 and the second electrode 114 is relevant to the width 106W of the insulation partition 106 and a coupling area between the first electrode 112 and the second electrode 114. The shape of the first electrode 112 and the second electrode 114 are determined by the first trench 102 and the second trench 104. In some embodiments, the height 112H of the first electrode 112 is greater than the width 112W of the first electrode 112 and the height 114H of the second electrode 114 is greater than the width 114W of the second electrode 114. A ratio of the height of the first electrode 112 to the width of the first electrode 112 ranges from 2 to 10 and a ratio of the height of the second electrode 114 to the width of the second electrode 114 ranges from 2 to 10.

Figure 3A:
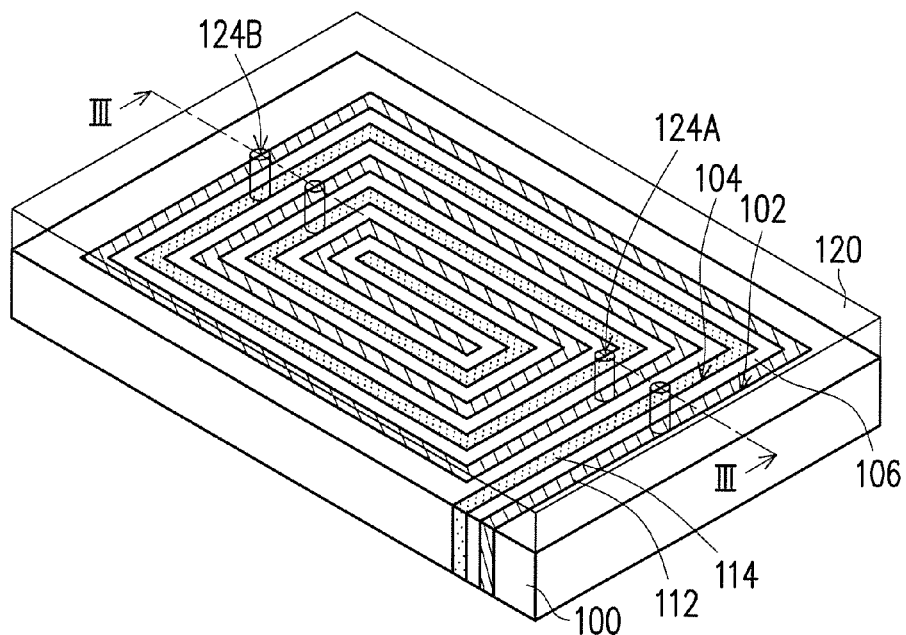
FIG. 3A schematically illustrates a step of a method of fabricating a capacitor structure of an integrated circuit chip in accordance with some embodiments.
Figure 3B:
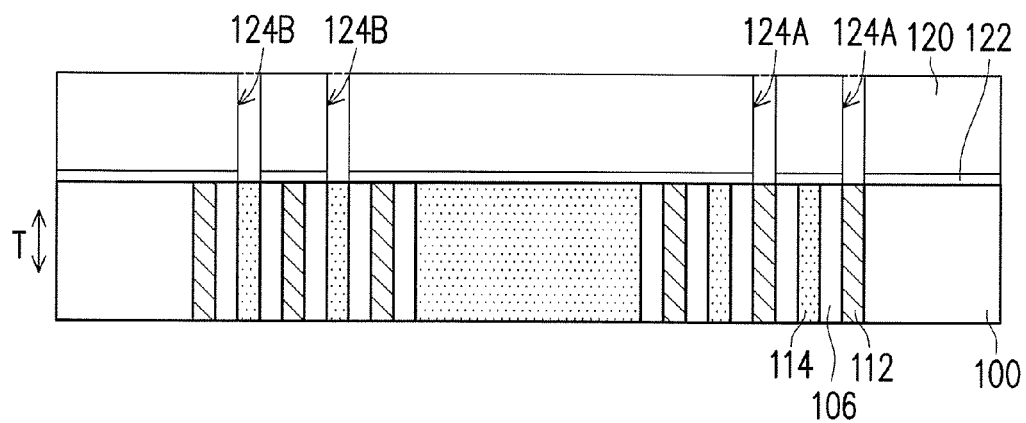
FIG. 3B schematically illustrates a cross sectional view of the structure depicted in FIG. 3A along the line III-III.

Referring to FIG. 3A and FIG. 3B, a covering insulation layer 120 is formed to cover the first electrode 112, the second electrode 114 and the insulation layer 100. The covering insulation layer 120 may include silicon oxide, silicon nitride, silicon oxy-nitride or multiple layers of insulation materials, such as silicon oxide and silicon nitride. In some embodiments, the material of the insulation layer 100 can be different from the material of the covering insulation layer 120. For example, the dielectric constant of the insulation layer 100 can be greater than the covering insulation layer 120. In alternative embodiments, the insulation layer 100 and the covering insulation layer 120 include the same material. In an embodiment, an etching stop layer 122 can be formed to cover the first electrode 112, the second electrode 114 and the insulation layer 100 before the formation of the covering insulation layer 120. The etching stop layer 122 includes a material different from the covering insulation layer 120 to provide the etching stop function for forming a structure, such as through holes, in the covering insulation layer 120.

In some embodiments, a plurality of through holes 124A and 124B are formed in the covering insulation layer 120, wherein the through holes 124A expose the first electrode 112 and the through holes 124B expose the second electrode 114. For forming the through holes 124A and 124B, a photoresist is formed on an insulation material layer. Subsequently, a lithography process is performed by using a photo mask having a least one light shielding pattern thereon. During the lithography process, a radiation passing through the photo mask irradiates on the photoresist and therefore, a portion of the photoresist is exposed to the radiation while the rest portion thereof is not. Subsequently, the photoresist is developed such that the pattern of the photo mask is transferred to the photoresist. An etching process is then performed by using the developed and patterned photoresist as an etching mask to form the through holes 124A and 124B in the covering insulation layer 120. The etching stop layer 122 has a material different from the covering insulation layer 120 and is served as the etching stop for forming the through holes 124A and 124B.

In the embodiment, the first electrode 112 and the second electrode 114 substantially extend to the same elevation. Accordingly, the through holes 124A and 124B are formed to have similar or the same depth. In addition, the first electrode 112 and the second electrode 114 respectively have a sufficient height in the thickness direction T, such that the through holes 124A still expose the first electrode 112 without exposing a component underlying the first electrode 112 in the case that an over-etching issue occurs and, similarly, the through holes 124B still expose the second electrode 114 without exposing a component underlying the second electrode 114 in the case that an over-etching issue occurs. Accordingly, the process window of manufacturing the through holes 124A and 124B is enhanced.

Figure 4A:
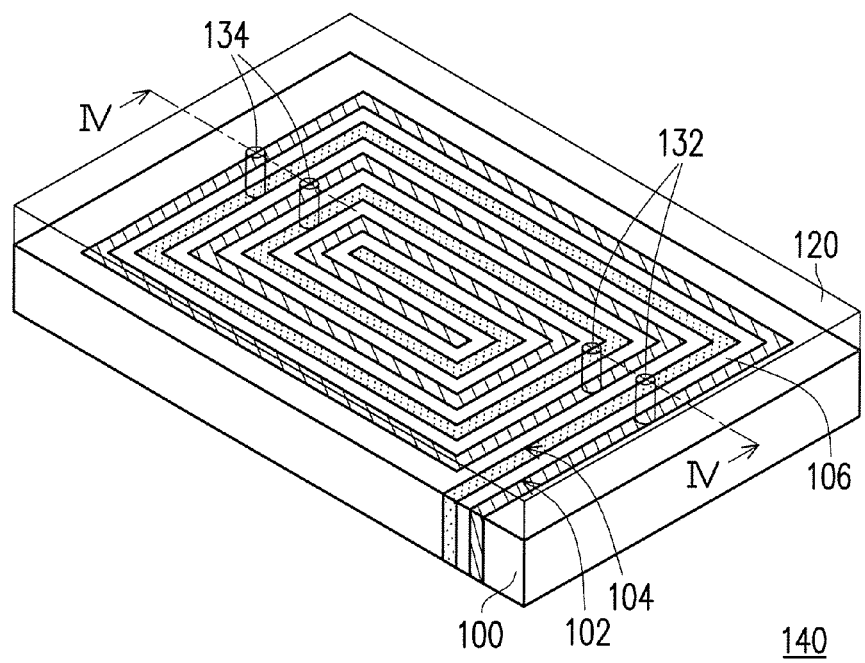
FIG. 4A schematically illustrates a step of a method of fabricating a capacitor structure of an integrated circuit chip in accordance with some embodiments.
Figure 4B:
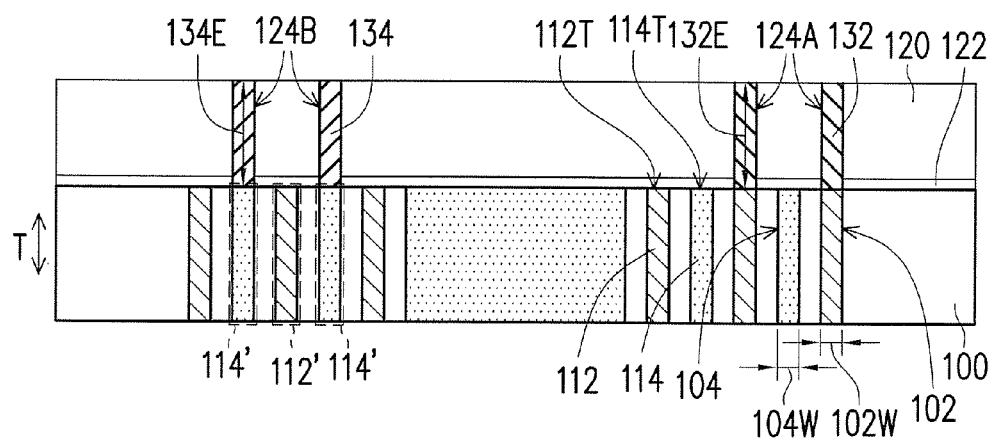
FIG. 4B schematically illustrates a cross sectional view of the structure depicted in FIG. 4A along the line IV-IV.

Referring to FIG. 4A and FIG. 4B, first conductive vias 132 and second conductive vias 134 are formed in the through holes 124A and 124B to pass through the covering insulation layer 120 and respectively contact the first electrode 112 and the second electrode 114. The first conductive vias 132 formed in the through holes 124A contact different portions of the first electrode 112. The second conductive vias 134 formed in the through holes 124B contact different portions of the second electrode 114. In some embodiments, the method of forming the first conductive vias 132 and the second conductive vias 134 includes filling a conductive material in the through holes 124A and 124B of the covering insulation layer 120. The conductive material filling the through holes 124A and 124B includes, for example, titanium, tungsten, aluminum, copper, metal alloys, metal silicide, other suitable materials, and/or combinations thereof. The material of the first and second conductive vias 132 and 134 can be the same to or different from the material of the first and second electrodes 112 and 114.

As shown in FIG. 4A and FIG. 4B, the first conductive vias 132 contacting the first electrode 112 at the level substantially the same or equivalent to the level that the second conductive vias 134 contact the second electrode 114. An extending depth 132E of each first conductive via 132 is equivalent to an extending depth 134E of each second conductive via 134. In the step shown in FIG. 3B, the process window of manufacturing the through holes 124A and 124B is enhanced. Therefore, no matter the first electrode 112 and the second electrode 114 are formed on a substantially smooth topography or not, the first conductive vias 132 and the second conductive vias 134 are easily fabricated to connect with the first electrode 112 and the second electrode 114 without causing an unwanted short circuit or an unwanted open circuit. Accordingly, the yield rate of manufacturing the conductive vias 132 and 134 is improved.

In FIG. 4A and FIG. 4B, a capacitor structure 140 includes the insulation layer 100, the first electrode 112, the second electrode 114, the covering insulation layer 120, the first conductive vias 132 and the second conductive vias 134. The insulation layer 100 includes the insulation partition 106 that separates the first trench 102 from the second trench 104. The first electrode 112 and the second electrode 114 are respectively disposed within the first trench 102 and the second trench 104. The first electrode 112 and the second electrode 114 are separated by the insulation partition 106 and arranged along the insulation partition 106. In addition, the covering insulation layer 120 is disposed on the polished top surfaces of the first electrode 112, the second electrode 114 and the insulation layer 100. The first conductive vias 132 and the second conductive vias 134 pass through the covering insulation layer 120. The first conductive vias 132 contact the first electrode 112 at the level equivalent to the level that the second conductive vias 134 contact the second electrode 114.

In the embodiment, the first electrode 112 and the second electrode 114 are parallel to each other and parallel to the thickness direction T of the insulation layer 100. In addition, the trajectories of the first electrode 112 and the second electrode 114 on the plane of the insulation layer 100 are respectively arranged in a spiral manner. The capacitance between the first electrode 112 and the second electrode 114 is proportional to the extending length of the trajectories of the first electrode 112 and the second electrode 114. Therefore, the capacitor structure 140 helps to provide a large capacitance within a small area. In one instance, as shown in FIG. 4B, portions of the first electrode 112 and portions of the second electrode 114 are repeated and alternately arranged in a direction parallel to the plane of the insulation layer 100. One portion 112' of the first electrode 112 is located between two portions 114' of the second electrode 114. Accordingly, one side of the portion 112' of the first electrode 112 is coupled to one of the two portions 114' while an opposite side of the portion 112' is coupled to the other of the portions 114', which enhances the capacitance coupling between the first electrode 112 and the second electrode 114. Simultaneously, the layout area of the first electrode 112 and the second electrode 114 needs not be enlarged.

Figure 5:
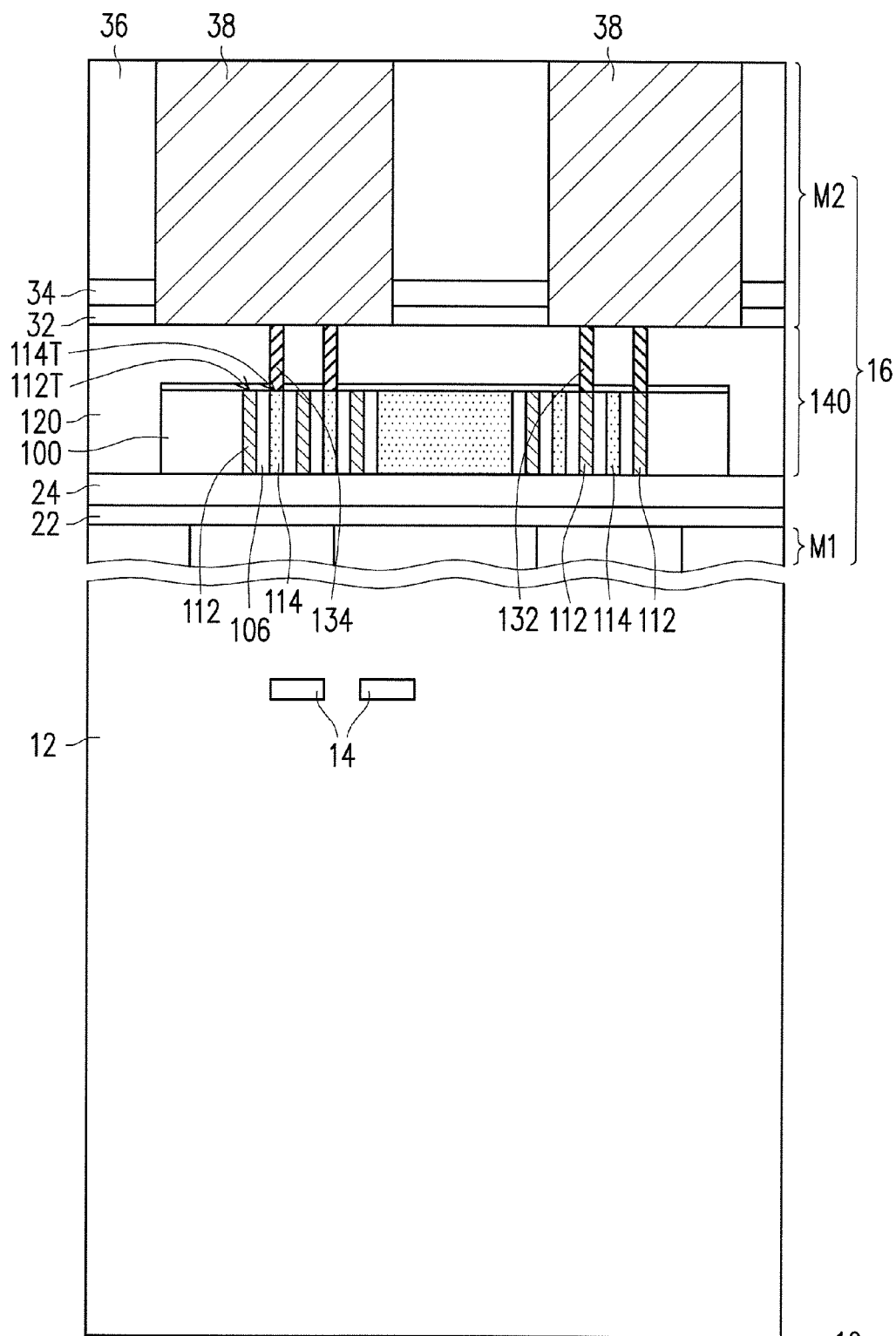
FIG. 5 schematically illustrates a capacitor structure of an integrated circuit chip in accordance with some embodiments.

Referring to FIG. 5, the capacitor structure 140 is disposed in an integrated circuit chip 10. The integrated circuit chip 10 includes a substrate 12 having a plurality of semiconductor components 14 and an interconnection layer 16 disposed on the substrate 12. In some embodiment, the interconnection layer 16 is equipped with a plurality of metal wiring layers, and the metal wiring layer M1 and the metal wiring layer M2 are two adjacent metal wiring layers among them. The capacitor structure 140 is located between the metal wiring layer M1 and the metal wiring layer M2. In addition, the semiconductor components 14 include transistors, diode or the like.

As shown in FIG. 5, the metal wiring layer M1 can be covered by one etching stop layer 22 and an underlying insulation layer 24 is formed on the etching stop layer 22. The capacitor structure 140 is formed on the underlying insulation layer 24 in the embodiment. Alternatively, in some embodiments, the underlying insulation layer 24 can be the same to the insulation layer 100 of the capacitor structure 140. In some embodiments, the covering insulation layer 120 includes the material the same as the underlying insulation layer 24 while the insulation layer 100 equipped with the first electrode 112 and the second electrode 114 includes a material different from the covering insulation layer 120 and the underlying insulation layer 24. In one instance, the dielectric constant of the insulation layer 100 is selectively greater than at least one of the covering insulation layer 120 and the underlying insulation layer 24.

On top of the capacitor structure 140, another etching stop layer 32 is formed and a layer of anti-reflection 34 is selectively formed on the etching stop layer 32. Furthermore, an insulation layer 36 is formed on the layer of anti-reflection 34 and the metal wiring layer M2 is formed to include the metal patterns 38 connecting to the first conductive vias 132 and the second conductive vias 134. A material of the metal patterns 38 includes, for example, titanium, tungsten, aluminum, copper, metal alloys, metal silicide, other suitable materials, and/or combinations thereof. The material of the metal patterns 38 is the same to or different from the first conductive vias 132 and the second conductive vias 134. In the embodiment, the first conductive vias 132 are arranged in a concentration manner and the second conductive vias 134 are also arranged in a concentration manner, such that the first conductive vias 132 and the second conductive vias 134 are respectively connected to different metal patterns 38. One metal pattern 38 simultaneously covers multiple first conductive vias 132 and, similarly, another metal pattern 38 simultaneously covers multiple second conductive vias 134, such that the electric connections to the first and the second conductive vias 132 and 134 are easily established and the contact areas are enlarged to ensure the electric connection relationship. In some embodiments, the metal wiring later M2 further includes other metal patterns for electrically connecting to a component according to the chip design.

In some embodiments, the metal wiring layer M1 is polished and the etching stop layer 22, the underlying insulation layer 24 and the capacitor structure 140 are subsequently formed on the polished metal wiring layer M1. The polished metal wiring layer M1 provides a flat surface for forming the subsequent components such as the capacitor structure 140, which helps to enhance the yield rate of manufacturing the subsequent components. In alternative embodiments, though the metal wiring layer M1 is polished, the topography of the metal wiring layer M1 has a hillock due to the subsequent manufacture process. Therefore, the subsequently formed components, such as the etching stop layer 22, the underlying insulation layer 24 and the capacitor structure 140, are formed on an uneven surface. In the embodiment, the first electrode 112 and the second electrode 114 of the capacitor structure 140 are formed to be parallel to each other and parallel to the thickness direction T of the insulation layer 100, such that neither the first electrode 112 nor the second electrode 114 is formed to be conformed to or cover the topography of the metal wiring layer M1. In addition, the through holes 124A and 124B in FIG. 4B for the first conductive vias 132 and the second conductive vias 134 contacting the first electrode 112 and the second electrode 114 are formed to correctly expose the first electrode 112 and the second electrode 114 so that the connection between the electrode 112 and the conductive vias 132 and the connection between the electrode 114 and the conductive vias 134 are ensured without an unwanted open circuit or an unwanted short circuit. Accordingly, the hillock phenomenon of the metal wiring layer M1 has least influence on the yield rate of the capacitor structure 140.

In accordance with some embodiments of the present disclosure, a capacitor structure of an integrated circuit chip includes an insulation layer, a first electrode, and a second electrode. The insulation layer includes an insulation partition and has a first trench and a second trench separated from the first trench by the insulation partition. The first electrode is disposed in the first trench. The second electrode is disposed in the second trench. The first electrode is arranged along a spiral trajectory and surrounds a spiral channel, and the second electrode is disposed within the spiral channel.

In accordance with alternative embodiments of the present disclosure, a capacitor structure of an integrated circuit chip includes an insulation layer, a first electrode, a second electrode and a covering insulation layer. The insulation layer includes an insulation partition and has a first trench and a second trench separated from the first trench by the insulation partition. The first electrode is disposed within the first trench. The second electrode is disposed within the second trench. The covering insulation layer covers the insulation layer, the first electrode and the second electrode. A dielectric constant of the insulation layer is greater than a dielectric constant of the covering insulation layer.

In accordance with alternative embodiments of the present disclosure, a method of fabricating a capacitor structure of an integrated circuit chip includes at least the following steps. An insulation layer s patterned to form a first trench and a second trench separated from the first trench. The first trench and the second trench extend downwardly from a top surface of the insulation layer. A conductive material fills into the first trench and the second trench to respectively form a first electrode and a second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor structure of an integrated circuit chip, comprising:
   an insulation layer comprising an insulation partition and having a first trench and a second trench separated from the first trench by the insulation partition;
   a first electrode disposed in the first trench;
   a second electrode disposed in the second trench, wherein the first electrode is arranged along a spiral trajectory and surrounds a spiral channel, and the second electrode is disposed within the spiral channel.

2. The capacitor structure as claimed in claim 1, wherein the first electrode and the second electrode are parallel to each other.

3. The capacitor structure as claimed in claim 1, wherein the insulation partition has a constant width.

4. The capacitor structure as claimed in claim 1, wherein a height of the insulation partition is greater than a width of the insulation partition.

5. The capacitor structure as claimed in claim 1, wherein the integrated circuit chip comprises a substrate having a plurality of semiconductor components and an interconnection layer disposed on the substrate, the interconnection layer comprises a plurality of metal wiring layers and the capacitor structure is disposed between adjacent two of the metal wiring layers.

6. The capacitor structure as claimed in claim 1, further comprising a covering insulation layer covering the insulation layer, the first electrode and the second electrode.

7. The capacitor structure as claimed in claim 6, further comprising a first contact pillar and a second contact pillar, wherein the first contact pillar and the second contact pillar pass through the covering insulation layer and respectively contact the first electrode and the second electrode.

8. The capacitor structure as claimed in claim 7, wherein an extending depth of the first contact pillar is equivalent to an extending depth of the second contact pillar.

9. The capacitor structure as claimed in claim 1, wherein a height of the first electrode is equivalent to a depth of the first trench and a height of the second electrode is equivalent to a depth of the second trench.

10. A capacitor structure of an integrated circuit chip, comprising:
- an insulation layer comprising an insulation partition and having a first spiral-shaped trench and a second spiral-shaped trench separated from the first spiral-shaped trench by the insulation partition;
- a first spiral-shaped electrode disposed within the first spiral-shaped trench;
- a second spiral-shaped electrode disposed within the second spiral-shaped trench; and
- a covering insulation layer covering the insulation layer, the first spiral-shaped electrode and the second spiral-shaped electrode, wherein the first spiral-shaped electrode surrounds the second spiral-shaped electrode.

11. The capacitor structure as claimed in claim 10, further comprising a first conductive via and a second conductive via, wherein the first conductive via and the second conductive via pass through the covering insulation layer and respectively contact the first spiral-shaped electrode and the second spiral-shaped electrode.

12. The capacitor structure as claimed in claim 10, wherein the integrated circuit chip comprises a substrate having a plurality of semiconductor components and an interconnection layer disposed on the substrate, the interconnection layer comprises a plurality of metal wiring layers and the capacitor structure is disposed between adjacent two of the metal wiring layers.

13. The capacitor structure as claimed in claim 10, wherein a height of the first spiral-shaped electrode is equivalent to a depth of the first spiral-shaped trench and a height of the second spiral-shaped electrode is equivalent to a depth of the second spiral-shaped trench.

14. The capacitor structure as claimed in claim 10, wherein the first spiral-shaped electrode and the second spiral-shaped electrode are parallel to each other.

15. A method of fabricating a capacitor structure of an integrated circuit chip, comprising:
- patterning an insulation layer to form a first trench and a second trench separated from the first trench, wherein the first trench and the second trench extend downwardly from a top surface of the insulation layer; and
- filling a conductive material into the first trench and the second trench to respectively form a first electrode and a second electrode, wherein the first electrode is arranged along a spiral trajectory and surrounds a spiral channel, and the second electrode is disposed within the spiral channel.

16. The method of fabricating the capacitor structure as claimed in claim 15, wherein the first trench and the second trench are formed by one lithography and etch process with one photo mask.

17. The method of fabricating the capacitor structure as claimed in claim 15, further performing a planarization process after forming the first electrode and the second electrode.

18. The method of fabricating the capacitor structure as claimed in claim 17, wherein the planarization process comprises polishing the first electrode, the second electrode and the insulation layer.

19. The method of fabricating the capacitor structure as claimed in claim 15, further forming a covering insulation layer covering the first electrode, the second electrode and the insulation layer.

20. The method of fabricating the capacitor structure as claimed in claim 19, further forming a first conductive via and a second conductive via passing through the covering insulation layer to respectively contact the first electrode and the second electrode.

* * * * *